(12) United States Patent
Ito

(10) Patent No.: US 8,770,864 B2
(45) Date of Patent: Jul. 8, 2014

(54) RECEPTACLE ASSEMBLY AND TRANSCEIVER MODULE ASSEMBLY

(71) Applicant: Yamaichi Electronics Co., Ltd., Tokyo (JP)

(72) Inventor: Toshiyasu Ito, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 13/845,588

(22) Filed: Mar. 18, 2013

(65) Prior Publication Data

US 2013/0251314 A1    Sep. 26, 2013

(30) Foreign Application Priority Data

Mar. 23, 2012  (JP) .................................. 2012-067781

(51) Int. Cl.
*G02B 6/36*    (2006.01)
(52) U.S. Cl.
USPC .............................. 385/88; 385/92

(58) Field of Classification Search
USPC ..................................................... 385/88–94
See application file for complete search history.

(56) References Cited

U.S. PATENT DOCUMENTS

| 7,566,246 B2 * | 7/2009 | Moore et al. ............. 439/607.01 |
| 2003/0171016 A1 * | 9/2003 | Bright et al. ................... 439/160 |
| 2007/0117458 A1 * | 5/2007 | Winker et al. ................ 439/607 |

FOREIGN PATENT DOCUMENTS

| JP | A-2005-520296 | 7/2005 |
| WO | WO 03/077626 A1 | 9/2003 |

* cited by examiner

*Primary Examiner* — Ellen Kim
(74) *Attorney, Agent, or Firm* — Oliff PLC

(57) ABSTRACT

An optical module receptacle assembly includes a receptacle cage to detachably house an optical module, a receptacle connector housed in a receptacle connector accommodating portion of the receptacle cage, and a connector cover covering the receptacle connector. A given clearance CLE, which is greater than a clearance CLD being set smaller than a clearance CLA, is formed between an upper surface of a tip end portion of a plug connector of the optical module and an inner peripheral surface of a slot of the receptacle connector.

7 Claims, 19 Drawing Sheets

RECEPTACLE ASSEMBLY AND TRANSCEIVER MODULE ASSEMBLY

CROSS-REFERENCES TO RELATED APPLICATIONS

This application claims the benefit of Japanese Patent Application No. 2012-067781, filed Mar. 23, 2012 which is hereby incorporated by reference herein in its entirety.

BACKGROUND OF THE INVENTION

1. Field of the Invention

The present invention relates to a receptacle assembly and a transceiver module assembly.

2. Description of the Related Art

In an optical communication system, a transceiver module has been put into practical use in order to transmit an optical signal transmitted through an optical connector and the like to a mother board. As disclosed in Japanese Patent Laid-Open No. 2005-520296, for example, such a transceiver module is located in a chassis which constitutes a communication system. The transceiver module includes the following constituents as main elements, namely, an optical module (referred to as a module assembly in Japanese Patent Laid-Open No. 2005-520296), and an optical module receptacle (referred to as a receptacle assembly in Japanese Patent Laid-Open No. 2005-520296) mounted on a circuit board as a mother board and configured to detachably house the optical module.

An optical cable connector and an optical cable for establishing mutual connection with another system, for example, are connected to a port at an end portion of the optical module exposed in a front cover of the chassis. When the optical module is connected to the optical module receptacle, a connector end portion of the optical module is connected to a connection portion being connected of a receptacle connector mounted on the circuit board inside the optical module receptacle. The connection portion being connected of the receptacle connector is electrically connected to the above-mentioned circuit board. Accordingly, the optical cable connector and the optical cable are electrically connected to the circuit board via the transceiver module.

SUMMARY OF THE INVENTION

The above-described receptacle assembly disclosed in Japanese Patent Laid-Open No. 2005-520296 is mounted on a host circuit board. The receptacle connector constituting part of the receptacle assembly is mounted on the host circuit board inside a guide frame by soldering or the like. At that time, the receptacle connector is located with a predetermined clearance from an inner peripheral portion of the guide frame.

Moreover, the above-described module assembly includes a printed circuit board inside a housing thereof. When the module assembly is connected to the above-described receptacle assembly, an end of the printed circuit board is made pluggable by being inserted into a connector slot of the receptacle connector in the receptacle assembly. In this case, a tip end portion of the module assembly is supported by the receptacle connector by way of the end of the printed circuit board.

In this configuration, if an undesirable impact force, for example, is applied to the host circuit board or the module assembly for some reason in the state where the module assembly is connected to the receptacle assembly, a stress corresponding to the impact force may concentrate on the end of the printed circuit board and the receptacle connector. Such stress concentration may lead to solder separation at the receptacle connector and breakage of the end of the printed circuit board.

In view of the above-described problem, the present invention aims to provide a receptacle assembly and a transceiver assembly. The receptacle assembly and a transceiver assembly can increase an impact resistant performance of the receptacle assembly and avoid breakage of an optical module.

To achieve the above-described object, a receptacle assembly to be mounted on a wiring board in a casing of a communication system according to the present invention comprises: a connector having a slot to which a tip end portion of a plug connector of an optical module is to be detachably connected, the plug connector being provided at one end portion of a module board included in the optical module; a receptacle cage made of a metal, including, a module accommodating portion made of a metal and configured to detachably accommodate the optical module, the module accommodating portion having a module slot provided at one end to allow the optical module to pass therethrough, and having a bottom wall portion to be in contact with a lower surface of the optical module, and a connector accommodating portion made of a metal, the connector accommodating portion communicating with the module accommodating portion and accommodating the connector; and a connector cover provided in the connector accommodating portion, for covering the connector, wherein when the tip end portion of the plug connector is connected to the slot of the connector, a first clearance formed between an upper surface of the tip end portion of the plug connector and an inner peripheral surface of the slot of the connector is greater than a second clearance formed between an inner peripheral surface of at least one opening of the connector cover facing an open end of the slot of the connector and a proximal portion of the plug connector.

A thickness of the proximal portion of the plug connector may be greater than a thickness of the tip end portion of the plug connector. The receptacle assembly may be that in which: the optical module has a protection wall provided in at least one of an upper member and a lower member, and arranged to face the plug connector, the upper member and the lower member together forming a occupancy space to accommodate the module board with the plug connector protruding outward; the connector cover has a first opening and a second opening through which the plug connector and the protection wall respectively pass when the tip end portion of the plug connector is connected to the slot of the connector; and a width dimension of the second opening is set smaller than a corresponding width dimension of the proximal end of the plug connector.

In addition, a transceiver module assembly to be mounted on a wiring board in a casing of a communication system according to the present invention comprises: an optical module including a module board provided with a plug connector at one end; and the foregoing receptacle assembly.

A thickness of the proximal portion of the plug connector may be greater than a thickness of the tip end portion of the plug connector. The transceiver module assembly may be that in which: the optical module has a protection wall provided in at least one of an upper member and a lower member, and arranged to face the plug connector, the upper member and the lower member together forming a occupancy space to accommodate the module board with the plug connector protruding outward; the connector cover includes a first opening and a second opening through which the plug connector and the protection wall respectively pass when the tip end portion of the plug connector is connected to the slot of the connector; and a width dimension of the second opening is set smaller than a corresponding width dimension of the proximal end of the plug connector. A projection length of the first protection wall is set greater than a projection length of the second protection wall.

According to the receptacle assembly and the transceiver module of the present invention, when the tip end portion of the plug connector is connected to the slot of the connector, the first gap formed between the upper surface of the tip end portion of the plug connector and the inner peripheral surface of the slot of the connector is greater than the second gap formed between the inner peripheral surface of at least one of the openings of the connector cover facing the open end of the slot of the connector and the proximal portion of the plug connector. Thus, there is no likelihood of the upper surface of the tip end portion of the plug connector coming into contact with the inner peripheral surface of the slot of the connector. As a consequence, it is possible to increase an impact resistant performance of the receptacle assembly and to avoid breakage of the optical module.

Further features of the present invention will become apparent from the following description of exemplary embodiments (with reference to the attached drawings).

DESCRIPTION OF THE EMBODIMENTS

Figure 2:
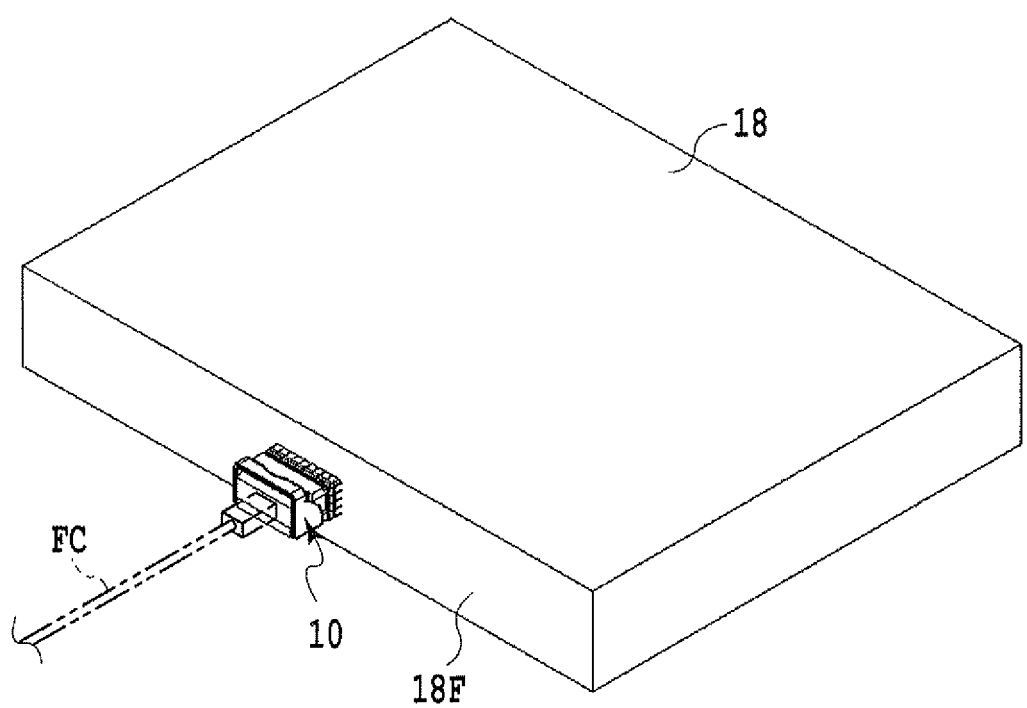
FIG. 2 is a perspective view schematically showing external appearance of a casing on which an example of a transceiver module assembly according to the present invention is mounted.

FIG. 2 shows an example of a transceiver module assembly according to the present invention together with a casing 18 in which to place the assembly.

An end portion of an optical module 14 of a transceiver module assembly 10 to be described later protrudes out of an operating end surface 18F of the casing 18. An optical connector, which is connected to one end of an optical cable FC, is connected to a port provided at the end portion of the optical module 14. The other end of the optical cable FC is connected to an optical connector of another casing which constitutes a communication system which is omitted.

Figure 3:
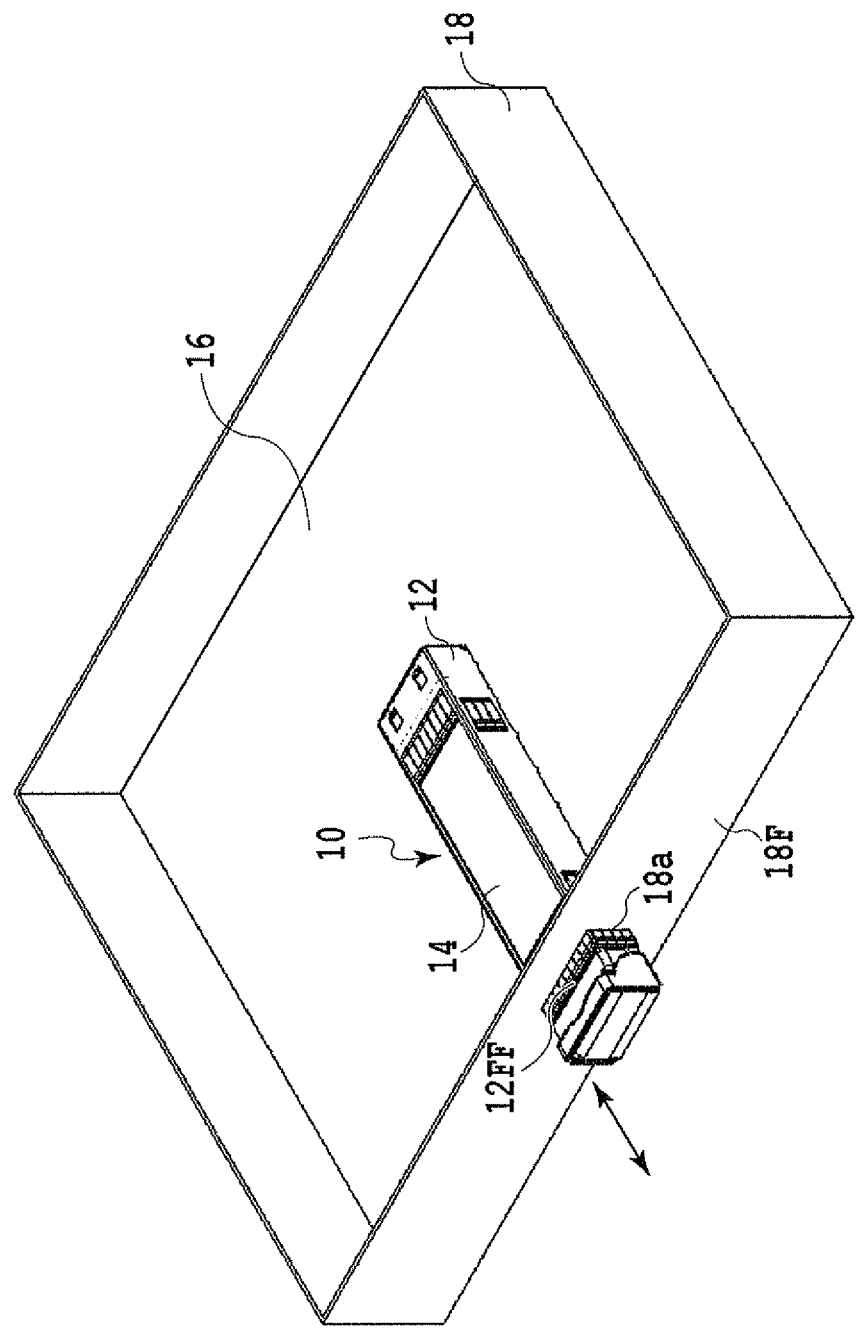
FIG. 3 is a perspective view showing an internal configuration of the casing in the example shown in FIG. 2.

As shown in FIG. 3, the casing 18 configured to form an enclosed space inside contains a printed wiring board 16 on which the transceiver module assembly 10 is mounted. In FIG. 3, one transceiver module assembly 10 is mounted on one printed wiring board 16. However, the invention is not limited only to this example and multiple transceiver module assemblies 10 may be mounted on one printed wiring board 16.

An opening 18a is formed in the operating end surface 18F of the casing 18. A front EMI finger 12FF, which is made of a metal and provided at an end portion on a module slot side of the a receptacle cage 12 to be described later, is inserted into the opening 18a.

The transceiver module assembly 10 comprises the optical module 14 and an optical module receptacle assembly.

Figure 5:
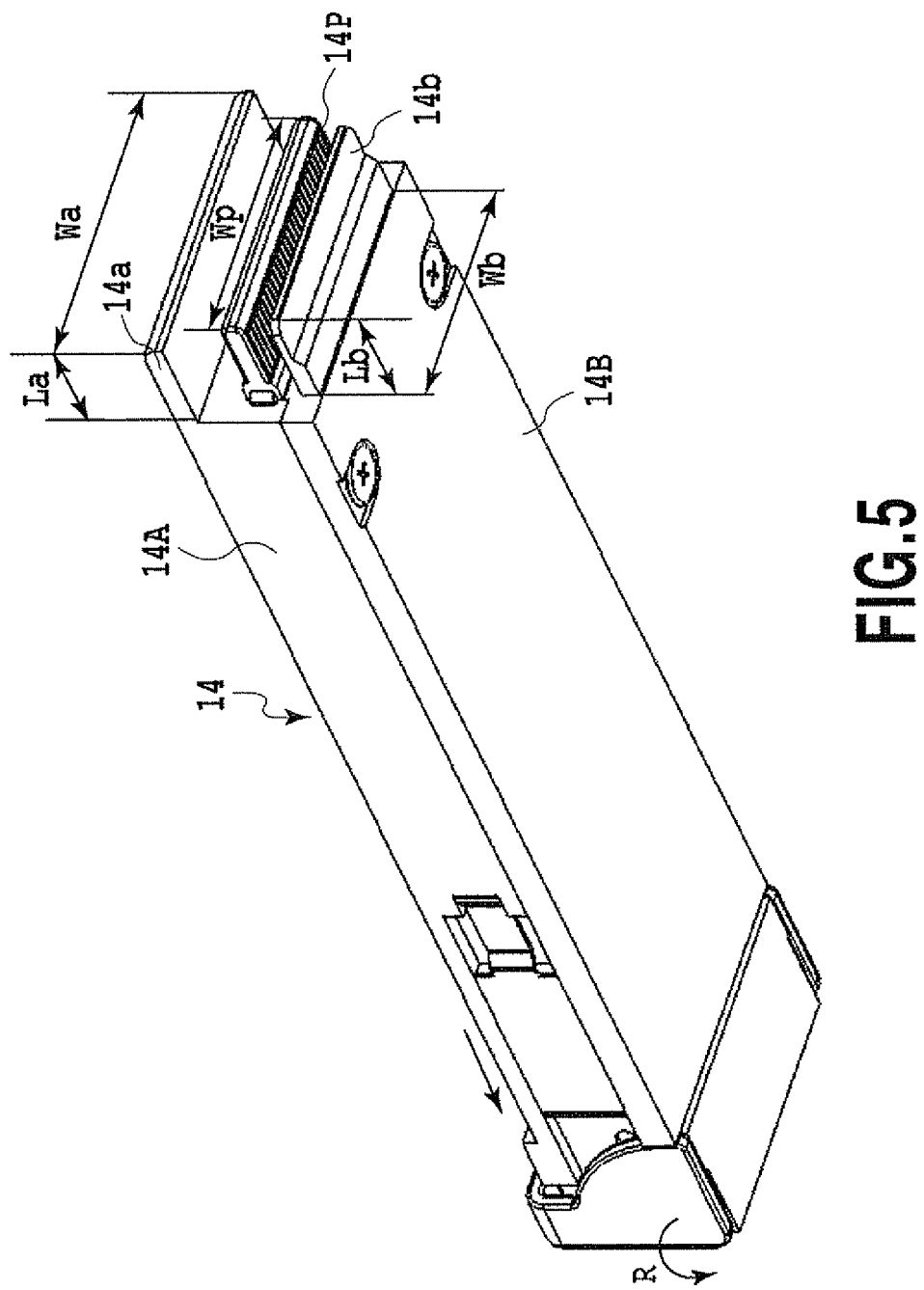
FIG. 5 is a perspective view showing external appearance of the optical module.

As shown in FIG. 5, the optical module 14 comprises the following constituents as main elements, namely, an upper case 14A and a lower plate 14B being made of a metal and together constituting an outer shell unit, and a module board 14S (see FIG. 6A) to be located at a predetermined position in a occupancy space formed between the upper case 14A and the lower plate 14B.

Figure 6A:
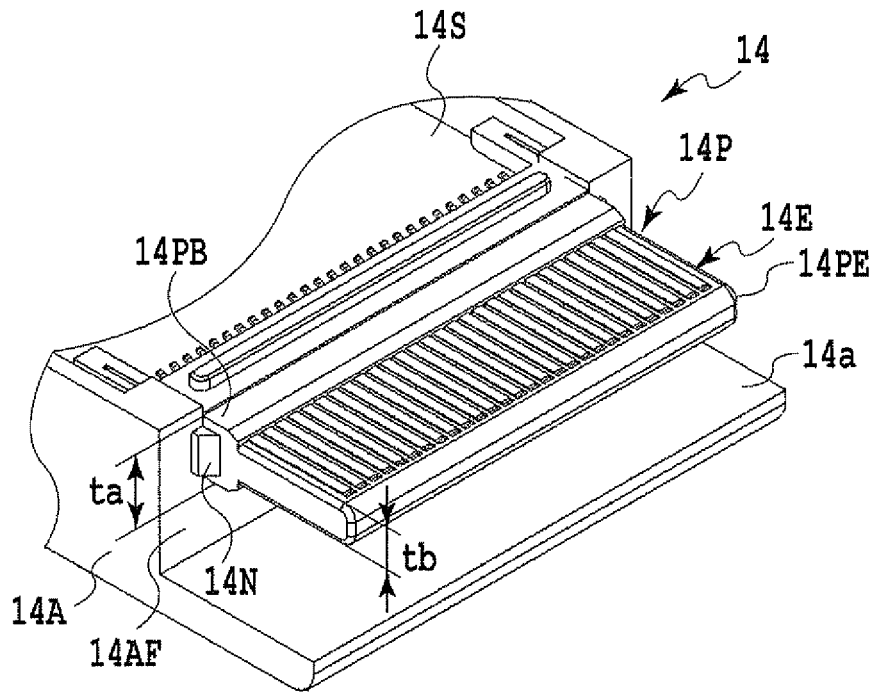
FIG. 6A is a partial enlarged perspective view showing a portion of the optical module shown in FIG. 5 in a state where a lower plate is detached therefrom.

As shown in FIG. 6A, the upper case 14A serving as an upper member has an open lower end. A protection wall 14a in a thin plate shape is formed on one end portion of the upper case 14A in such a manner as to be continuous with an upper surface of the upper case 14A and to protrude in a longitudinal direction. The protection wall 14a serving as a first protection wall and a protection wall 14b serving as a second protection wall, which will be described later, shall protect a plug connector 14P to be described later in the event that the optical module 14 is dropped by mistake. A latch mechanism is provided at the other end portion of the upper case 14A as shown in FIG. 5. The latch mechanism comprises a release plate and a latch lever. When the latch lever is rotationally moved in a direction indicated with an arrow R in FIG. 5, i.e., in a counterclockwise direction, to a virtual plane shared with a lower surface of the lower plate 14B, a fixing piece of the release plate moves in the direction indicated with an arrow to be detached from a locking piece 12LF to be described later and the latch lever is set to an unlocked state. Moreover, when the latch lever is rotationally moved in a direction opposite to the direction indicated with the arrow R in FIG. 5, the fixing piece of the release plate is fixed with the locking piece 12LF of a receptacle cage 12 to be described later. Thus, the optical module 14 is set to a locked state with respect to the receptacle cage 12.

As enlarged in FIG. 6A, the module board 14S has an electrode portion 14E constituting the plug connector 14P on one end portion of the module board 14S. A plurality of contact pads are arranged parallel to one another at given intervals on a common plane on each of front and back surfaces of the electrode portion 14E which is formed at a tip end portion 14PE of the plug connector 14P. As shown in FIG. 6A, a pair of nibs 14N are respectively formed near both side surfaces of the electrode portion 14E at a proximal portion 14PB of the plug connector 14P of the module board 14S (only one of the nibs 14N is illustrated in FIG. 6A). A thickness to of the proximal portion 14PB is set greater than a thickness tb of the tip end portion 14PE (the electrode portion 14E).

Figure 6B:
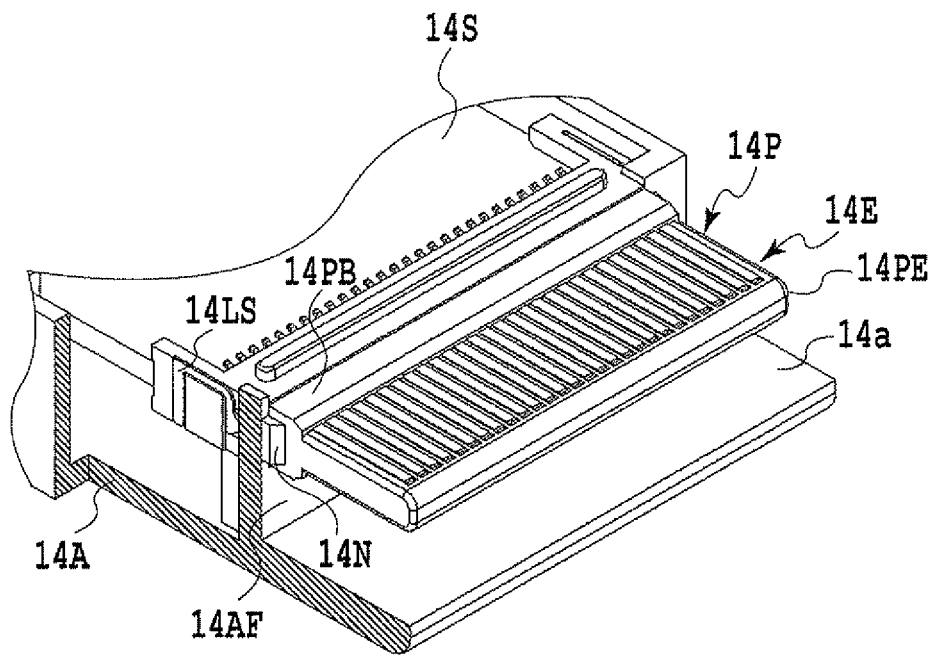
FIG. 6B is a partial cutaway perspective view showing a portion of the optical module shown in FIG. 6A.
Figure 6C:
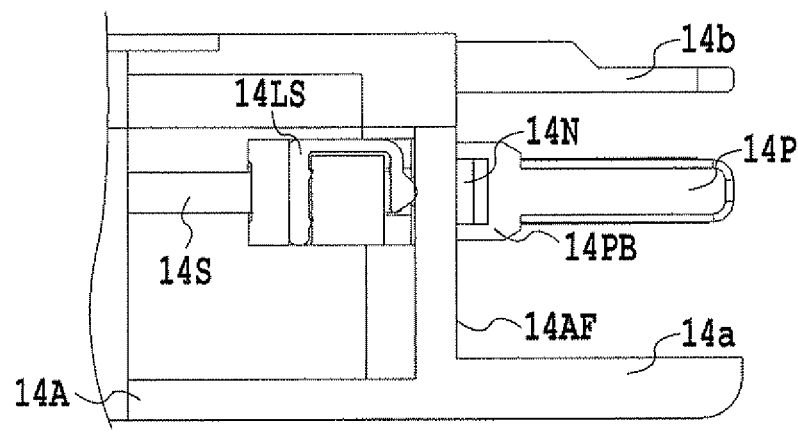
FIG. 6C is a partial cross-sectional view of a portion of the optical module shown in FIG. 6B.

The pair of nibs 14N are fixed with peripheral edges of a groove in a board support wall 14AF of the upper case 14A. As shown in FIG. 6C, the module board 14S is inserted into the groove such that the electrode portion 14E of the module board 14S is set substantially parallel to the protection wall 14a. As enlarged in FIG. 6B and FIG. 6C, leaf springs 14LS are provided at both side surface portions of the module board 14S across the board support wall 14AF, which faces the respective nibs 14N. The pair of nibs 14N are securely fixed to the board support wall 14AF as the respective leaf springs 14LS press the board support wall 14AF. Thus, a play between the module board 14S and the upper case 14A is eliminated. As a consequence, a projection length of the plug connector 14P from an end surface of the board support wall 14AF to a tip of the plug connector 14P is accurately controlled.

Figure 15:
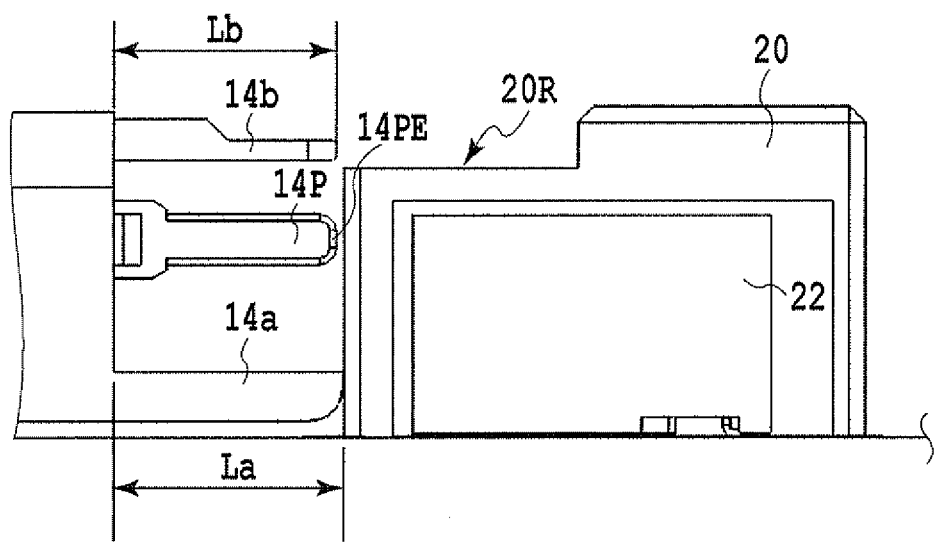
FIG. 15 is a side view of the example shown in FIG. 14.

As shown in FIG. 5, the lower plate 14B in a plate shape serving as a lower member is secured to the lower end of the above-described upper case 14A with machine screws in such a manner as to cover the opening at the lower end of the upper case 14A. As shown in FIG. 5, the protection wall 14b in a thin plate shape is formed on one end portion of the lower plate 14B in such a manner as to be continuous with a lower surface of the lower plate 14B and to protrude in the longitudinal direction. As shown in FIG. 6C, the protection wall 14b is formed substantially parallel to the plug connector 14P at a given interval and substantially parallel to the protection wall 14a at another given interval. As shown in FIG. 15, a projection length La of the protection wall 14a is set slightly greater than a projection length Lb of the protection wall 14b and the projection length of the plug connector 14P. Moreover, as shown in FIG. 5, a width Wa of the protection wall 14a is set greater than a width Wp of the proximal of the plug connector 14P and a width Wb of the protection wall 14b. The width Wp of the proximal portion of the plug connector 14P is set slightly greater than the width Wb of the protection wall 14b.

It should be noted that the invention is not limited only to this example and at least one of the protection wall 14a and the protection wall 14b may be provided in the optical module 14.

Figure 1:
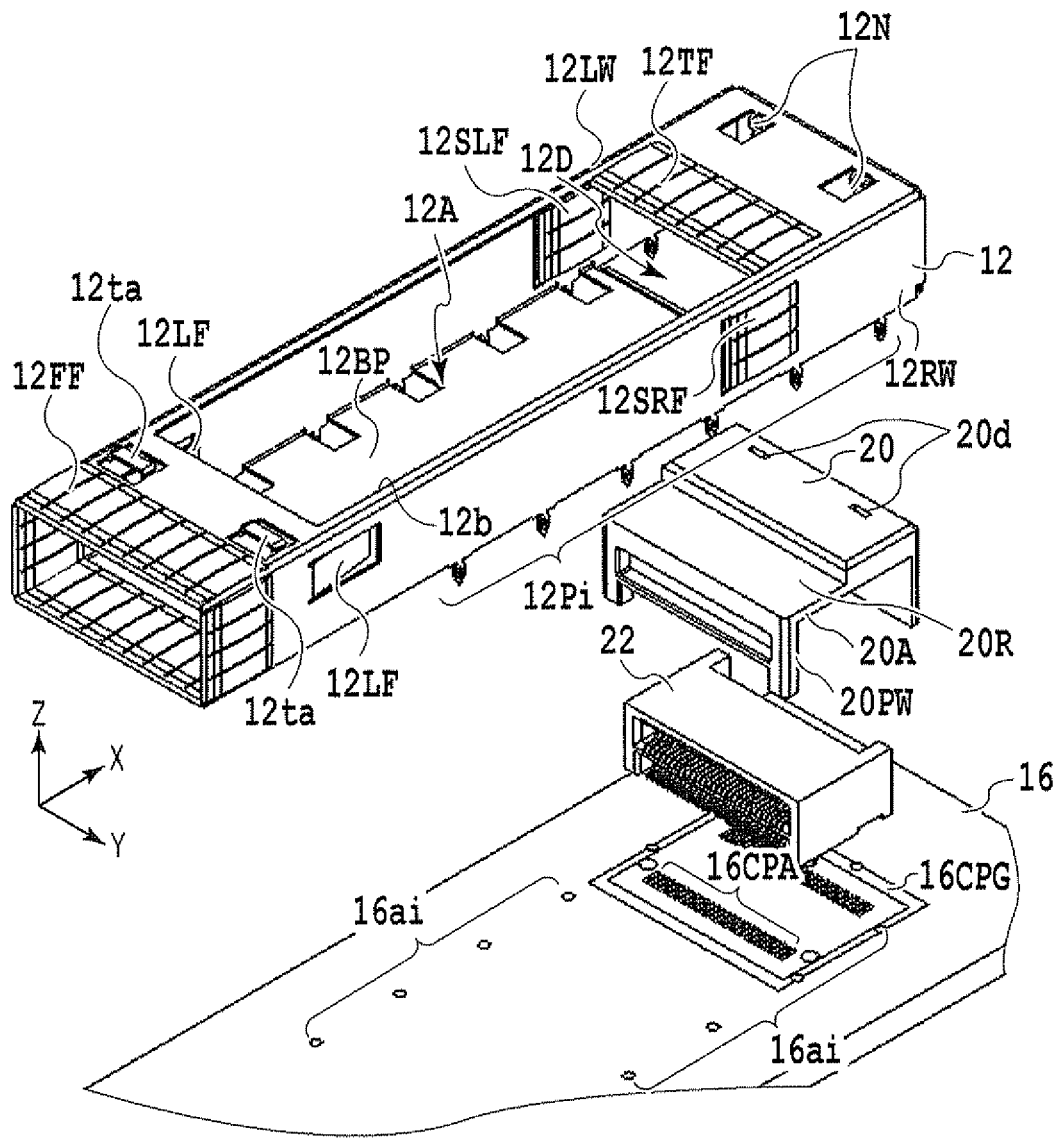
FIG. 1 is an exploded perspective view showing an example of a receptacle assembly according to the present invention.

As shown in FIG. 1, the optical module receptacle assembly comprises the following constituents as main elements, namely, the receptacle cage 12 located on the printed wiring board 16 and configured to detachably accommodate the above-described optical module 14, a receptacle connector 22 housed in a receptacle connector accommodating portion 12D of the receptacle cage 12, and a connector cover 20 covering the receptacle connector 22.

As shown in FIG. 1, for example, the receptacle cage 12 is made by pressing into shapes a thin plate of stainless steel or phosphor bronze, or more preferably stainless steel or phosphor bronze having good thermal conductivity. A module accommodating portion 12A and the receptacle connector accommodating portion 12D are provided inside the receptacle cage 12.

The module accommodating portion 12A is formed by being surrounded by side walls 12RW and 12LW which face each other at a given interval, and by a bottom wall portion 12B2 of the accommodating portion 12A. The side walls 12RW and 12LW extend in an X-coordinate axis direction in terms of a Cartesian coordinate system illustrated in FIG. 1, i.e., in a direction of attaching or detaching the optical module 14. Each of the side walls 12RW and 12LW has the locking piece 12LF located in the vicinity of a module slot to be described later. Each locking piece 12LF is selectively engaged with the fixing piece of the release plate of the optical module 14 described above so as to establish the locked state of the above-described optical module 14 with respect to the module accommodating portion 12A.

The module accommodating portion 12A has a module slot which is open in the X-coordinate axis direction at one end thereof. Hereby, the optical module 14 is attached and detached through the module slot. The tubular front EMI finger 12FF serving as a first shield member is provided on the entire peripheral edge of the module slot which has a substantially rectangular cross section. An inner peripheral portion of the front EMI finger 12FF comes into contact with an outer peripheral portion of the optical module 14 to be inserted into the unit 12FF. Moreover, an outer peripheral portion of the front EMI finger 12FF comes into contact with a peripheral edge of the opening 18a of the casing 18, for example. Herewith, when the receptacle cage 12 is press-fitted into the opening 18a of the casing 18 as shown in FIG. 3, a gap between the opening 18a of the casing 18 and the outer peripheral portion of the receptacle cage 12 is shielded by the front EMI finger 12FF made of a metal. As a consequence, noise is confined in the casing 18, and there is not a fear of a leak of noise into the outside through the gap between the outer peripheral portion of the optical module 14 and the inner peripheral portion of the module accommodating portion 12A.

Moreover, the end of the module accommodating portion 12A opposed to the module slot communicates with the inside of the receptacle connector accommodating portion 12D via a guide plate 20PW (see FIG. 4A) of the connector cover 20. A substantially rectangular opening 12b that is open along a Z coordinate axis is formed in a portion opposed to the bottom wall portion 12BP. A pair of hooks 12ta configured to selectively hold a pair of fixing pieces (see FIG. 16) of a heat sink holder 32 to be described later are integrally formed with the receptacle cage 12 on a peripheral edge of the opening 12b. The pair of hooks 12ta is formed in a line in a Y-coordinate axis direction at a given interval corresponding to the interval of the pair of fixing pieces.

Figure 4A:
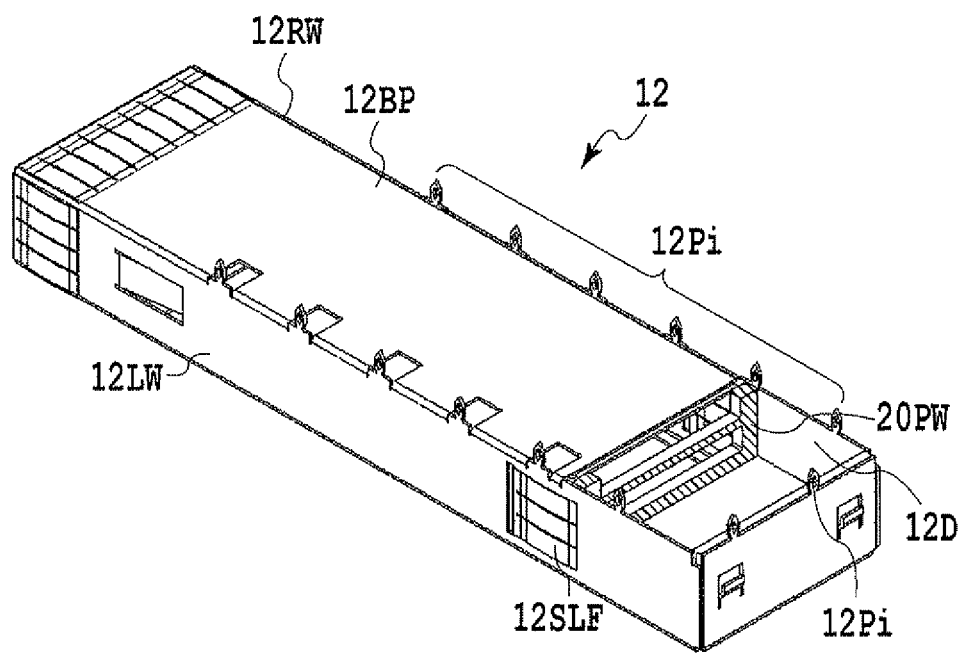
FIG. 4A is a perspective view showing an example of a receptacle cage according to the present invention.

As shown in FIG. 4A, both end portions on short sides of the bottom wall portion 12BP connecting lower ends of the side walls 12RW and 12LW come into contact with a surface of the printed wiring board 16. In addition, as enlarged in FIG. 12, one of the end portions on the short sides of the bottom wall portion 12BP is provided with a bent piece 12BPT, which comes into contact with a side of a looped ground contact pad 16CPG (see FIG. 1) formed on the surface of the printed wiring board 16 and is bent downward from the bottom wall portion 12BP. Hereby, the receptacle cage 12 is grounded via the bent piece 12BPT. Moreover, a portion of the bottom wall portion 12BP excluding the above-mentioned end portion on the short side is provided with a given clearance (an air layer) CLD from the surface of the printed wiring board 16 by means of the bent portion 12BPT, as enlarged in FIG. 12. Herewith, when the air inside the casing 18 flows through the clearance CLD with the assistance of a fan or the like, the bottom wall portion 12BP is cooled down by the air layer whereby heat generated in the optical module 14 is efficiently dissipated through the receptacle cage 12. In addition, the conductive pattern formed on the surface can be additionally formed at a region on the printed wiring board 16 located below the portion of the bottom wall portion 12BP excluding the above-mentioned end portion on the short side. As a consequence, design freedom of the conductive pattern is also increased.

As shown in FIG. 4A, press-fitting nibs 12Pi (i=1 to n, n is a positive integer) are formed at given intervals on both long sides of the bottom wall portion 12BP, respectively. As shown in FIG. 1, the press-fitting nibs 12Pi are respectively press-fitted into pores 16ai (i=1 to n, n is the positive integer) formed in the surface of the printed wiring board 16 corresponding to the array of the press-fitting nibs 122i. Herewith, a lower end surface of the receptacle cage 12 is fixed tightly to the surface of the printed wiring board 16. At that time, as partially enlarged in FIG. 4C, lower end surfaces 12EM1, 12EM2, 12EM3, and 12EM4 at a portion forming the receptacle connector accommodating portion 12D on the receptacle cage 12 are brought in intimate contact with the above-described ground contact pad 16CPG, thereby providing an EMI shield.

As enlarged in FIG. 4A, the receptacle connector accommodating portion 12D, which is open toward the surface of the printed wiring board 16, is formed by being surrounded by a receptacle connector-side closed end portion facing the module slot on the receptacle cage 12, an upper surface forming a peripheral edge of the opening 12b on the receptacle connector side, and receptacle connector-side portions of the side walls 12RW and 12LW.

Figure 11:
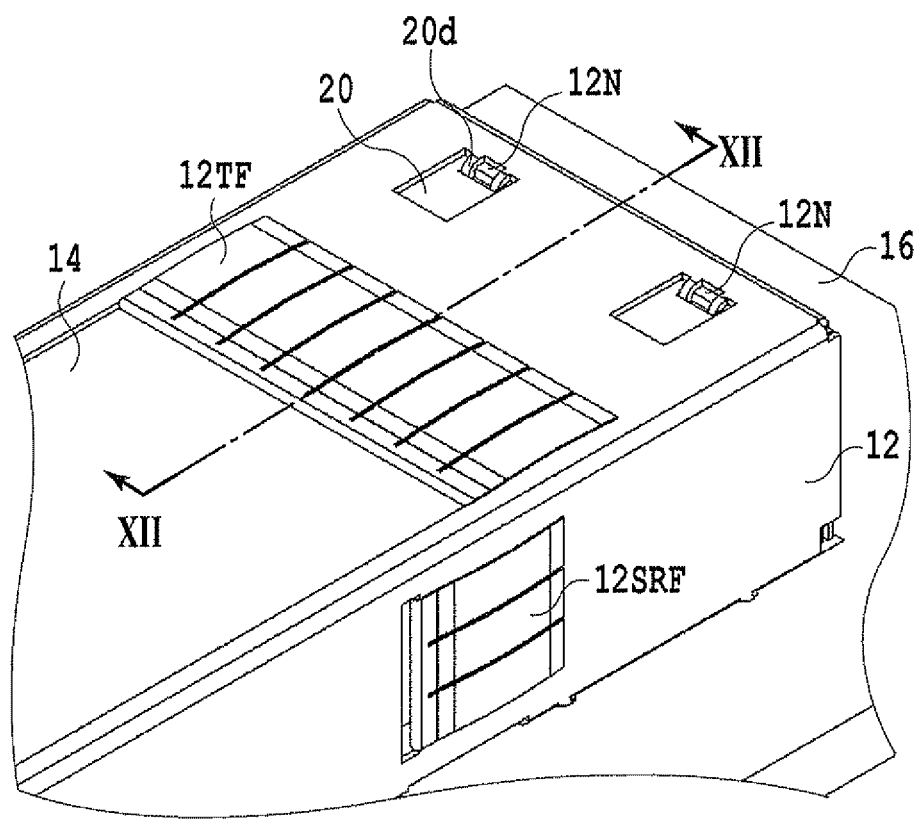
FIG. 11 is a partial enlarged perspective view of part of the transceiver module assembly shown in FIG. 2.

As shown in FIG. 1 and FIG. 11, a top EMI finger 12TF made of a metal and serving as a second shield member is provided in a portion constituting an upper surface of the receptacle connector accommodating portion 12D. When the plug connector 14P of the optical module 14 is connected to the receptacle connector 22, the top EMI finger 12TF is configured to come into contact with an outer peripheral surface of the protection wall 14a of the optical module 14, as enlarged in FIG. 12. In addition, as shown in FIG. 11, a pair of nibs 12N for holding the connector cover 20 to be described later are formed in positions closer to the receptacle connector-side closed end portion than the top EMI finger 12TF.

As shown in FIG. 1, side EMI fingers 12SRF and 12SLF made of a metal and serving as third shield members are also provided respectively at the side walls 12RW and 12LW in positions on the side walls 12RW and 12LW facing the guide plate 202W of the connector cover 20, namely, regions corresponding to a boundary portion between the receptacle connector accommodating portion 12D and the module accommodating portion 12A, for example. The side EMI fingers 12SRF and 12SLF face each other and extend in the longitudinal direction spreading across the boundary between the receptacle connector accommodating portion 12D and the module accommodating portion 12A. Accordingly, a position of one end portion of each side EMI finger 12SRF or 12SLF is located closer to the module slot than the position of an end portion of the top EMI finger 12TF.

Figure 4B:
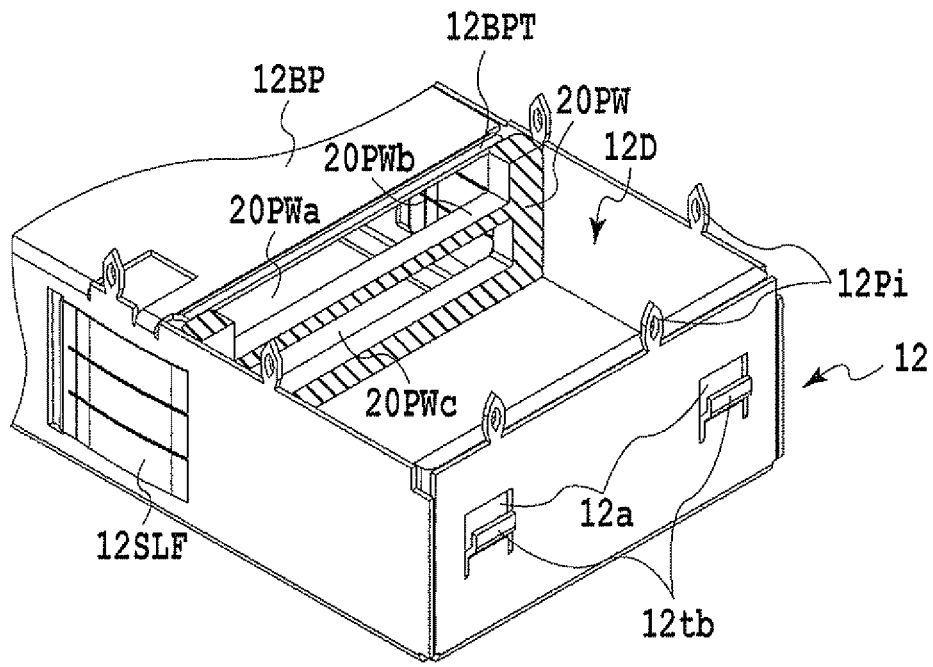
FIG. 4B is a partial enlarged perspective view showing a portion of the example shown in FIG. 4A.
Figure 4C:
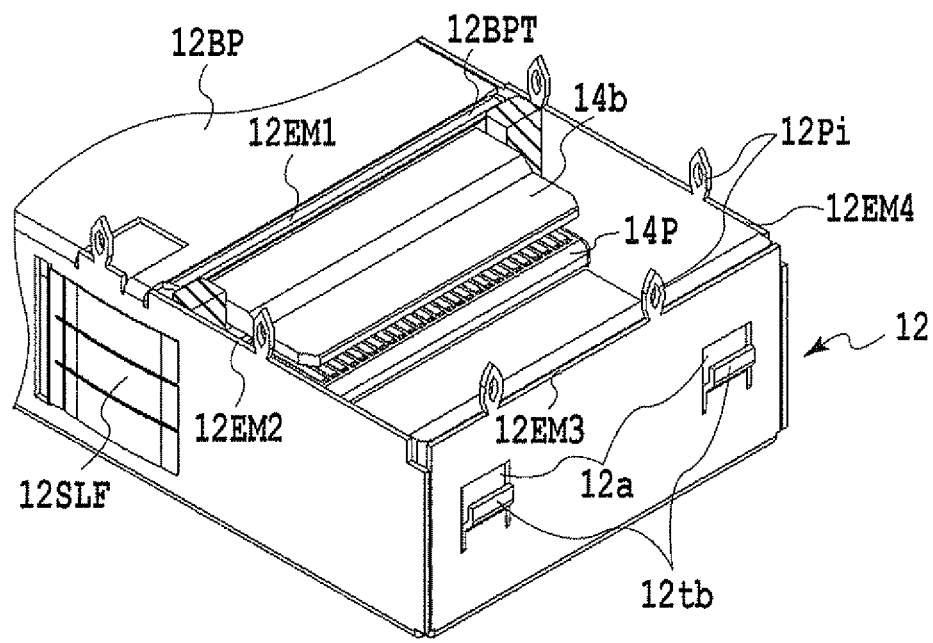
FIG. 4C is a perspective view showing a state of insertion of a plug connector of an optical module in the example shown in FIG. 4B.

Moreover, when the plug connector 142 of the optical module 14 is connected to the receptacle connector 22, the side EMI fingers 12SRF and 12SLF respectively come into contact with side surfaces of the upper case 14A and the lower plate 14B of the optical module 14 which are opposed thereto as shown in FIG. 4C and FIG. 11.

Accordingly, a gap between an inner peripheral surface of the receptacle cage 12 and outer peripheral surfaces of the upper case 14A and the lower plate 14B of the optical module 14 is shielded by the top EMI finger 12TF as well as the side EMI fingers 12SRF and 12SLF, while the lower plate 14B comes into contact with the bottom wall portion 12BP. Thus, the noise generated inside the optical module 14 is confined in the receptacle cage 12, and there is not a fear of a radiation of the noise to the casing 18 through the gap between the optical module 14 and the receptacle connector accommodating portion 12D.

As enlarged in FIG. 4B, a pair of hook members 12tb to be fixed with a pair of fixing pieces of the heat sink holder to be described later are formed integrally with the receptacle cage 12 on the receptacle connector-side closed end portion. An opening 12a is formed on a peripheral edge of each of the hook members 12tb.

Figure 10:
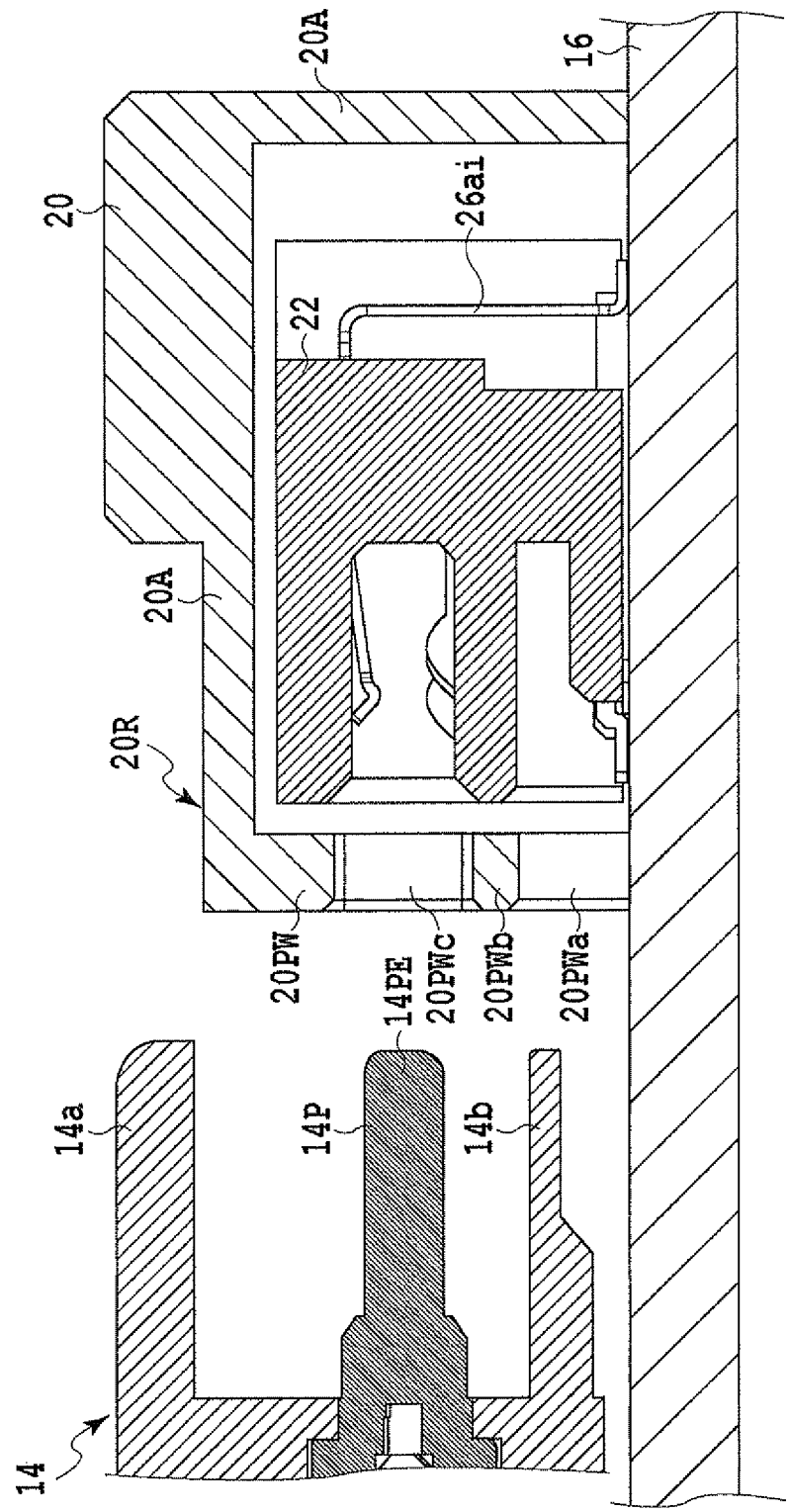
FIG. 10 is a cross-sectional view made available for explanation of an operation of the transceiver module assembly shown in FIG. 2.

The connector cover 20 is made of a metal material or a resin material, for example. As shown in FIG. 1 and FIG. 10, the connector cover 20 comprises the guide plate 20PW configured to guide the plug connector 14P of the optical module 14 when the optical module 14 is attached or detached, and a shield portion 20A configured to accommodate the receptacle connector 22 inside and to cover the receptacle connector 22 with a predetermined clearance in between.

The guide plate 20PW is formed integrally with the shield portion 20A, and is provided with a slot 20PWc into which the plug connector 14P of the optical module 14 is inserted in the case where the optical module 14 is connected, and a cutaway portion 20PWa into which the protection wall 14b of the optical module 14 is inserted in the same case. The slot 20PWc and the cutaway portion 20PWa are partitioned by a partition wall 20PWb. The guide plate 20PW is integrally formed in such a manner as to be orthogonal to the shield portion 20A that constitutes an upper surface portion of the connector accommodating portion. As shown in FIG. 4B, a length of the cutaway portion 20PWa of the guide plate 20PW corresponding to the width Wb of the protection wall 14b of the optical module 14 is set greater than the width Wb of the protection wall 14b and smaller than the width Wa of the protection wall 14a. A length of the slot 20PWc corresponding to the width Wp of the proximal portion of the plug connector 14P of the optical module 14 is set slightly greater than the width Wp.

Figure 12:
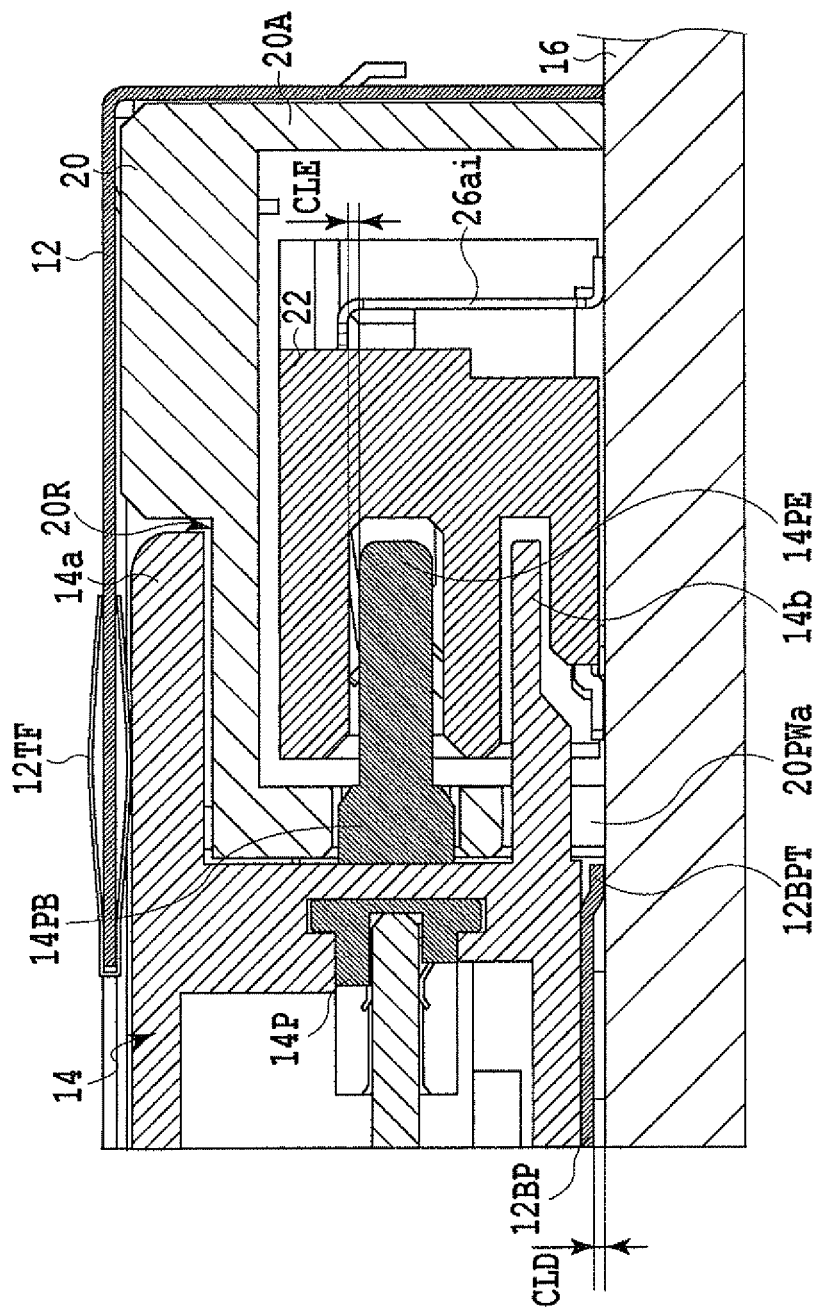
FIG. 12 is a cross-sectional view of the transceiver module assembly taken along the XII-XII line in FIG. 11.
Figure 14:
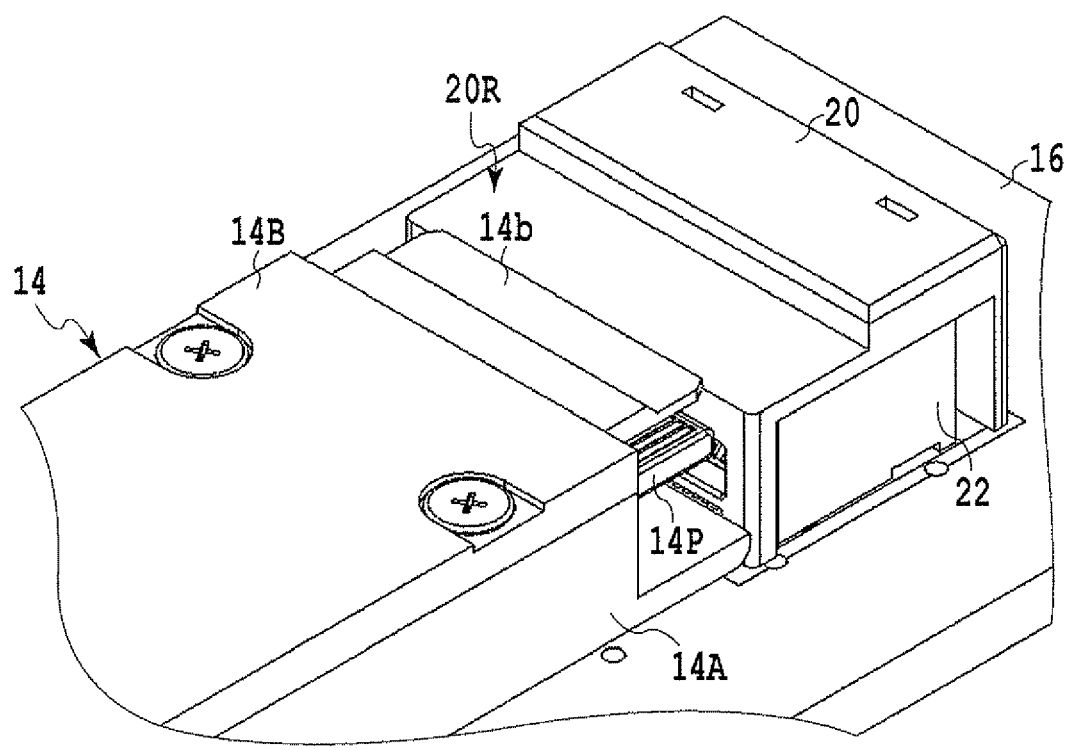
FIG. 14 is a cross-sectional view used for explanation of reverse insertion of the optical module into the transceiver module assembly shown in FIG. 2.

As shown in FIG. 10 and FIG. 12, a step height portion 20R, which is configured to guide the protection wall 14a of the optical module 14 when the optical module 14 is attached or detached, is formed in an upper part of an outer peripheral portion of the shield portion 20A of the connector cover 20. Hereby, as shown in FIG. 14 and FIG. 15, even if the optical module 14 is inserted in such a manner that the upper case 14A is directed to the bottom wall portion 12BP of the receptacle cage 12 by mistake, or in the case of so-called erroneous reverse insertion, the protection wall 14a is unlikely to be inserted either into the cutaway portion 20PWa or into the slot 20PWc because the width Wa of the protection wall 14a is greater than the corresponding lengths of the cutaway portion 20PWa and the slot 20PWc. Accordingly, if the optical module 14 is inserted into the receptacle cage 12, an end surface of the tip of the protection wall 14a comes into contact with an end surface of the guide plate 202W of the connector cover 20. Thus, erroneous insertion of the optical module 14 is prevented. At that time, the end surface of the tip of the protection wall 14a comes into contact with the end surface of the guide plate 20PW of the connector cover 20 whereas an end surface of the tip end 14PE of the plug connector 142 does not come into contact with the end surface of the guide plate 202W. Therefore, the tip end portion 142E of the plug connector 142 is prevented from breakage in case of erroneous insertion of the optical module 14.

In addition, as shown in FIG. 11, holes 20d into which the pair of nibs 12N of the receptacle cage 12 are press-fitted are formed in the connector cover 20 in positions near the step height portion 20R.

Figure 7:
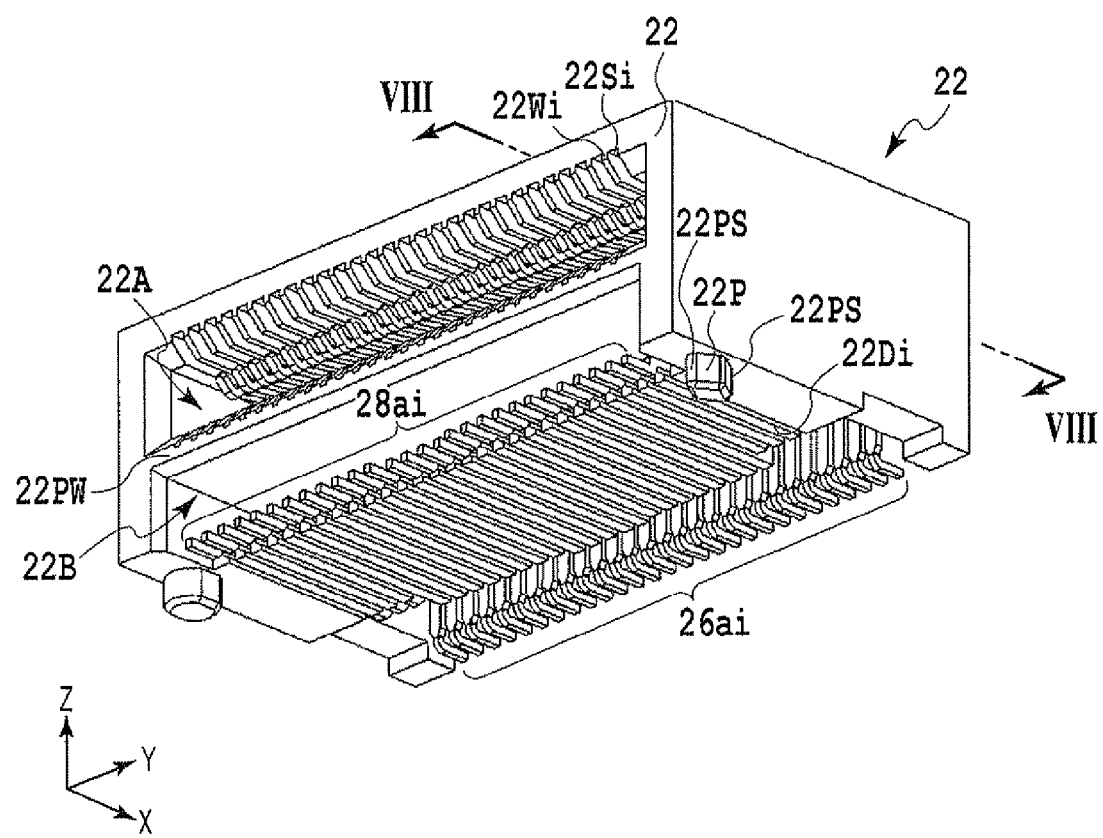
FIG. 7 is an enlarged perspective view showing a receptacle connector used in the example of the receptacle assembly shown in FIG. 1.
Figure 8:
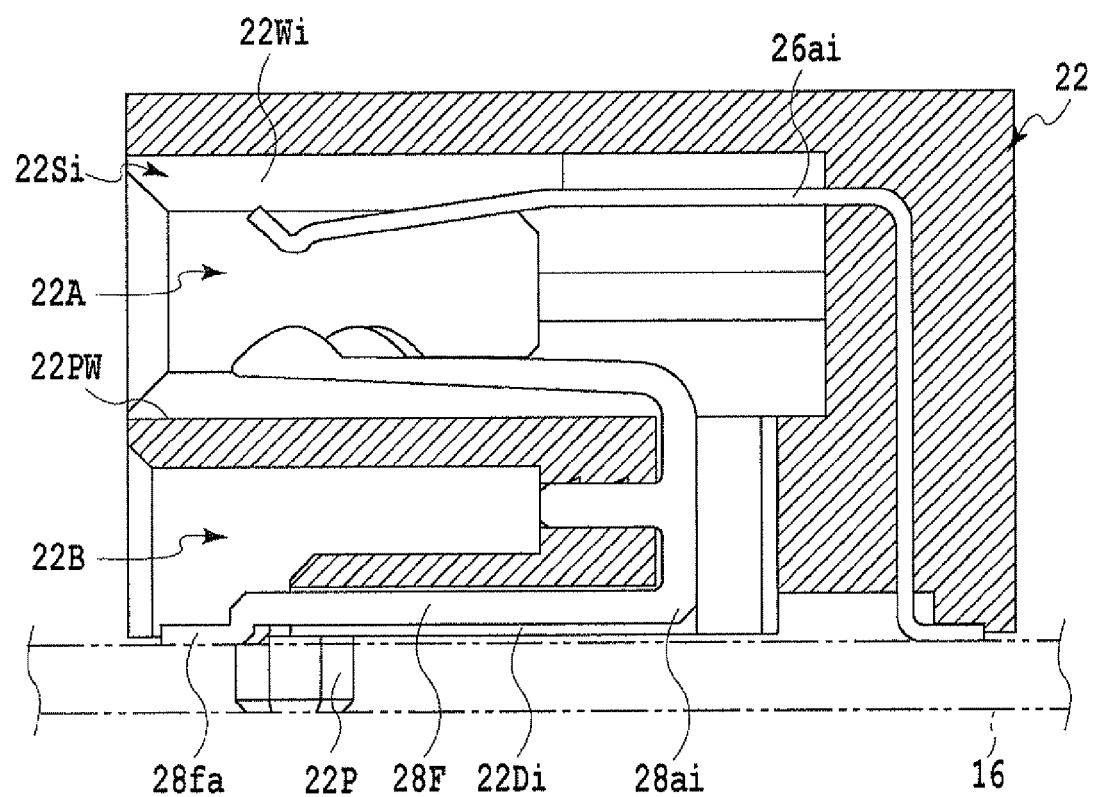
FIG. 8 is a cross-sectional view of the receptacle connector taken along the VIII-VIII line in FIG. 7.

As shown in FIG. 7 and FIG. 8, the receptacle connector 22 comprises a connector insulator provided with a slot 22A into which the plug connector 142 of the optical module 14 is detachably inserted, and a plurality of contact terminals 26ai and 28ai (i=1 to n, n is a positive integer).

Figure 9A:
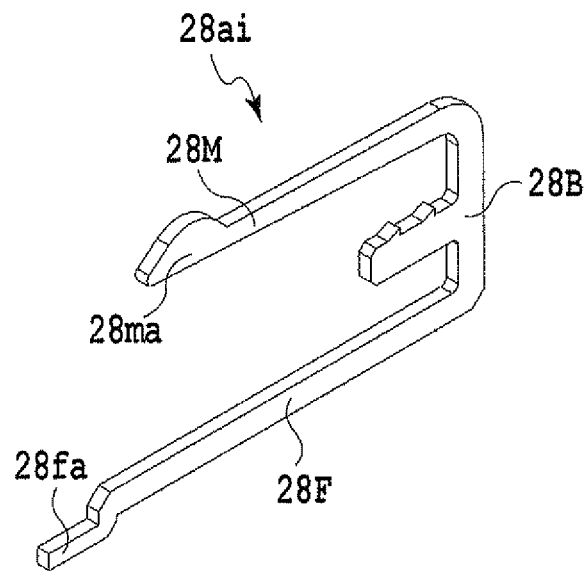
FIG. 9A is a perspective view illustrating a contact terminal used in the receptacle connector shown in FIG. 7.
Figure 9B:
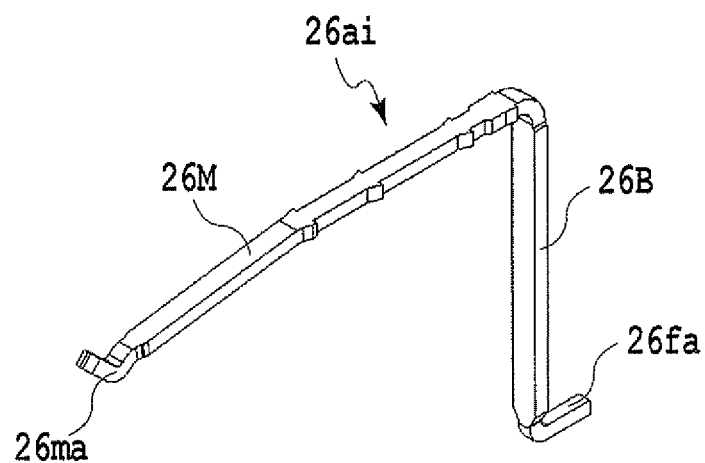
FIG. 9B is a perspective view showing contact terminal used in the receptacle connector shown in FIG. 7.

The connector terminals 26ai and 28ai are configured to connect the plug connector 142 of the optical connector 14 electrically to a group of electrodes 16CPA (see FIG. 1) which are connected to the conductive pattern on the printed wiring board 16. As enlarged in FIG. 9B, each contact terminal 26ai comprises: a movable contact portion 26M whose one end has a contact point 26ma to come into contact with the electrode portion 143 on the plug connector 142 of the optical connector 14; and a coupling portion 263 whose one end has a fixation terminal portion 26fa to be fixed to the group of electrodes 16CPA by soldering. The coupling portion 263 is formed to be integral with and orthogonal to the other end of the movable contact portion 26M. As enlarged in FIG. 9A, each contact terminal 28ai comprises: a movable contact portion 28M whose one end has a contact point 28ma to come into contact with the electrode portion 14E on the plug connector 14P of the optical connector 14; a fixation unit 283 whose one end has a fixation terminal portion 28fa to be fixed to the group of electrodes 16CPA by soldering; and a coupling portion 28B to couple the other end of the movable contact portion 28M to the other end of the fixation unit 28F. The coupling portion 28B is provided with a nib portion to be press-fitted and fixed to a wall portion which forms a slot 22B of the connector insulator.

The connector insulator is molded from a resin material. As shown in FIG. 7, the connector insulator has: the slot 22A which the plug connector 14P of the optical module 14 is to be attached to and detached from; and the slot 22B which the protection wall 14b is to be attached to and detached from. These double-deck slots 22A, 22B are formed along the Z-coordinate axis shown in FIG. 7. The slot 223 is formed below and substantially parallel to the slot 22A with a partition wall 22PW interposed therebetween.

A plurality of slits 22Si (i=1 to n, n is the positive integer) are formed at given intervals along the Y-coordinate axis in FIG. 7 in the slot 22A. Each two adjacent slits 22Si are partitioned by a partition wall 22Wi (i=1 to n, n is a positive integer). As shown in FIG. 8, the movable contact portion 26M of one of the contact terminals 26ai and the corresponding movable contact portion 28M of the contact terminal 28ai are located to face each other in each slit 22Si.

A plurality of slits 22Di (i=1 to n, n is the positive integer) are formed at given intervals along the Y-coordinate axis in FIG. 7 in the slot 22B. Each two adjacent slits 22Di are partitioned by a partition wall. As shown in FIG. 8, the fixation unit 28F of one of the contact terminals 28ai is located in each slit 22Di. Hereby, the fixation terminal portion 28fa of the contact terminal 28ai protrudes into the slot 22B. Accordingly, this configuration facilitates inspection and soldering at the time of maintenance.

As shown in FIG. 7, a plurality of positioning pins 22P to be fitted into positioning holes in the printed wiring board 16 are formed in a bottom portion of the connector insulator. Each positioning pin 22P has a pair of springs 22PS configured to hold an inner peripheral portion of the corresponding positioning hole by applying pressure when the positioning pin 22P is fitted into the positioning hole in the printed wiring board 16.

Figure 13A:
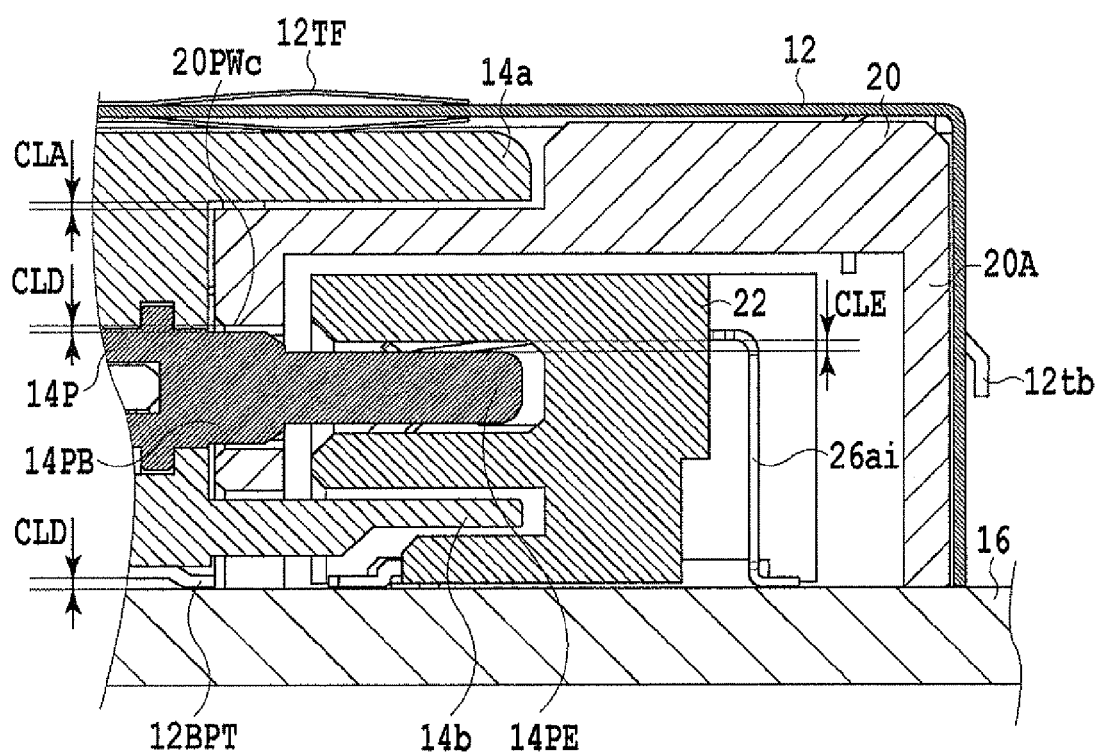
FIG. 13A is a cross-sectional view made available for explanation of an operation of the transceiver module assembly shown in FIG. 2.

In the above-described configuration, in a state where the plug connector 142 of the optical module 14 is connected to the contact terminals 26ai and 28ai inside the slot 22A of the receptacle connector 22 as shown in FIG. 13A, the protection wall 14a of the optical module 14 is biased toward the bottom wall portion 12BP by the top EMI finger 12TF. At that time, a given clearance CLD is formed between the proximal portion 14PB of the plug connector 142 of the optical module 14 and an inner peripheral surface of the slot 20PWc of the guide plate 202W of the connector cover 20. Moreover, a clearance CLA is formed between the protection wall 14a and the step height portion 20R of the connector cover 20. In addition, a given clearance CLE larger than the clearance CLD is also formed between an upper surface of the tip end portion 14PE of the plug connector 142 of the optical module 14 and an inner peripheral surface of the slot 22A of the receptacle connector 22. The clearance CLD is set smaller than the clearance CLA.

Figure 13B:
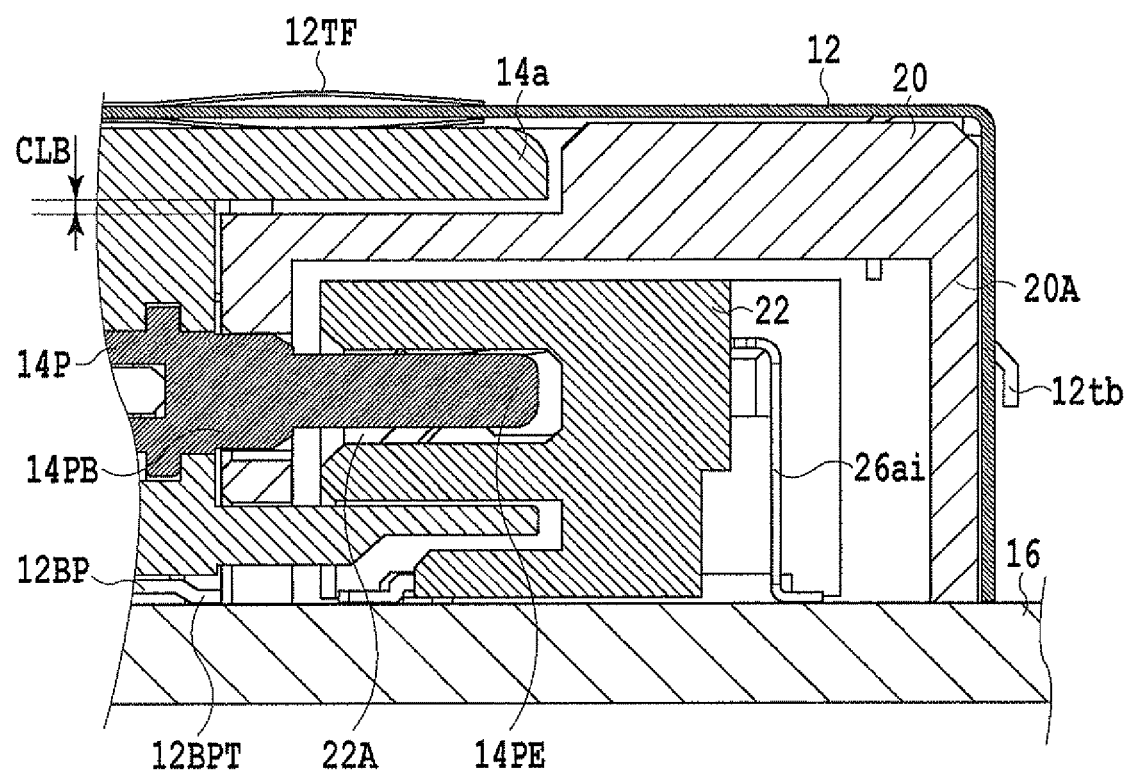
FIG. 13B is a cross-sectional view made available for explanation of an operation of the transceiver module assembly shown in FIG. 2.

In the above-described circumstance, when impact force in the Z-coordinate axis direction in FIG. 7 acts on the transceiver module assembly 10 and the printed wiring board 16 as shown in FIG. 13B whereby a clearance CLB between a lower surface of the protection wall 14a and an upper surface of the step height portion 20R of the connector cover 20 becomes greater than the clearance CLA, the proximal portion 14PB of the plug connector 142 comes into contact with the inner peripheral surface of the slot 20PWc of the guide plate 202W of the connector cover 20. Accordingly, because the clearance CLE is set greater than the clearance CLD in advance as described above, the plug connector 142 of the optical module 14 does not collide with the inner peripheral surface of the slot 22A of the receptacle connector 22. This avoids breakage of the tip end portion of the plug connector 14P, the connector terminals 26ai, and the like. In this case, because the thickness to of the proximal portion 14PB of the plug connector 142 is set greater than the thickness tb of the tip end portion 14PE thereof, flexural rigidity of the plug connector 142 is increased and it is possible to avoid breakage of the plug connector 14P resulting from touching between the proximal portion 14PB of the plug connector 142 and the inner peripheral surface of the slot 20PWc of the guide plate 20PW of the connector cover 20.

Figure 16:
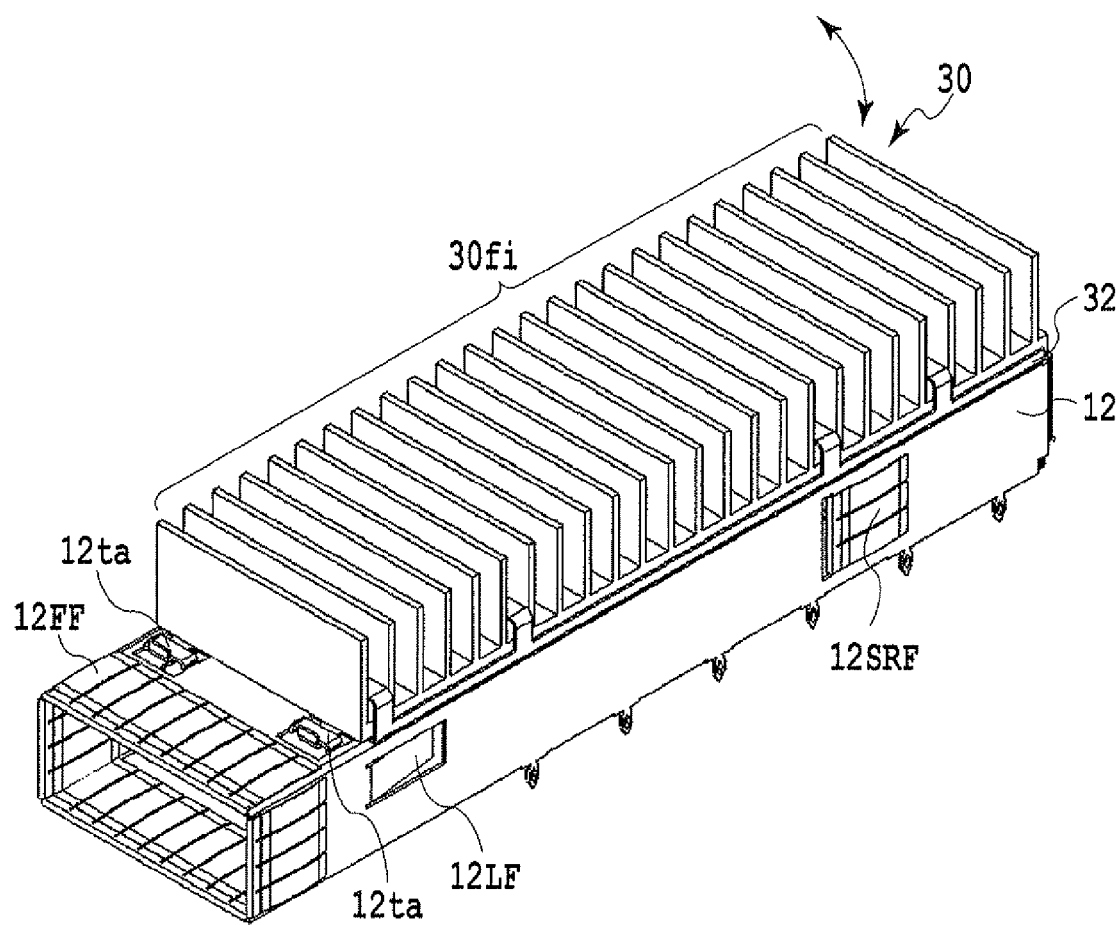
FIG. 16 is a perspective view showing a state where a heat sink is mounted on an upper part of the optical module receptacle assembly shown in FIG. 1.

As shown in FIG. 16, a heat sink 30 held by the heat sink holder 32 is detachably attached to an upper surface of the receptacle cage 12.

The heat sink holder 32 has: the pair of fixing pieces provided on one end of the heat sink holder 32 and designed to be detachably fixed with the pair of hooks 12ta provided on the upper surface of the receptacle cage 12; and the pair of fixing pieces provided on the other end of the heat sink holder 32 and designed to be detachably fixed with the pair of hooks 12tb provided at the receptacle connector-side closed end portion of the receptacle cage 12 at both ends. Herewith, the heat sink 30 can easily be attached to and detached from the receptacle cage 12 by turning the heat sink holder 32 together with the heat sink 30 pivotally around the hooks 12ta in directions indicated with arrows in FIG. 16.

The heat sink 30 is made of a metal having good thermal conductivity such as aluminum, and has a plurality of fins 30fi (i=1 to n, n is a positive integer) which are arranged parallel to one another at given intervals in the X-coordinate axis direction shown in FIG. 1.

In the above-described configuration, when the optical module 14 is attached to the receptacle cage 12, a heat transfer surface (not shown) formed at a lower end of the heat sink 30 comes into direct contact with the outer peripheral surface of the upper case 14A of the optical module 14 via the opening 12b. Hereby, the heat generated in the optical module 14 is efficiently dissipated to the atmosphere through the heat sink 30.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A receptacle assembly to be mounted on a wiring board in a casing of a communication system, comprising:
   a connector having a slot to which a tip end portion of a plug connector of an optical module is to be detachably connected, the plug connector being provided at one end portion of a module board included in the optical module;
   a receptacle cage made of a metal, including,
      a module accommodating portion made of a metal and configured to detachably accommodate the optical module, the module accommodating portion having a module slot provided at one end to allow the optical module to pass therethrough, and having a bottom wall portion to be in contact with a lower surface of the optical module, and
      a connector accommodating portion made of a metal, the connector accommodating portion communicating with the module accommodating portion and accommodating the connector; and
   a connector cover provided in the connector accommodating portion, for covering the connector, wherein
   when the tip end portion of the plug connector is connected to the slot of the connector, a first clearance formed between an upper surface of the tip end portion of the plug connector and an inner peripheral surface of the slot of the connector is greater than a second clearance formed between an inner peripheral surface of at least one opening of the connector cover facing an open end of the slot of the connector and a proximal portion of the plug connector.

2. The receptacle assembly according to claim 1, wherein a thickness of the proximal portion of the plug connector is greater than a thickness of the tip end portion of the plug connector.

3. The receptacle assembly according to claim 1, wherein
   the optical module has a protection wall provided in at least one of an upper member and a lower member, and arranged to face the plug connector, the upper member and the lower member together forming a occupancy space to accommodate the module board with the plug connector protruding outward,
   the connector cover has a first opening and a second opening through which the plug connector and the protection wall respectively pass when the tip end portion of the plug connector is connected to the slot of the connector, and
   a width dimension of the second opening is set smaller than a corresponding width dimension of the proximal end of the plug connector.

4. A transceiver module assembly to be mounted on a wiring board in a casing of a communication system, comprising:
   an optical module including a module board provided with a plug connector at one end; and
   the receptacle assembly according to claim 1.

5. The transceiver module assembly according to claim 4, wherein a thickness of the proximal portion of the plug connector is greater than a thickness of the tip end portion of the plug connector.

6. The transceiver module assembly according to claim 4, wherein
   the optical module has a protection wall provided in at least one of an upper member and a lower member, and arranged to face the plug connector, the upper member and the lower member together forming a occupancy space to accommodate the module board with the plug connector protruding outward,
   the connector cover comprises a first opening and a second opening through which the plug connector and the protection wall respectively pass when the tip end portion of the plug connector is connected to the slot of the connector, and
   a width dimension of the second opening is set smaller than a corresponding width dimension of the proximal end of the plug connector.

7. The transceiver module assembly according to claim 6, wherein the optical module has a first protection wall and a second protection wall provided to an upper member and a lower member, respectively, and arranged to face each other while interposing the plug connector therebetween, the upper member and the lower member together forming a occupancy space to house the module board with the plug connector protruding outward, and a projection length of the first protection wall is set greater than a projection length of the second protection wall.

* * * * *